(12) United States Patent
Vegelahn

(10) Patent No.: US 8,820,611 B2
(45) Date of Patent: Sep. 2, 2014

(54) METHOD AND APPARATUS FOR PRINTING A SUBSTRATE, IN PARTICULAR A PRINTED CIRCUIT BOARD, WITH A PRINTING PASTE

(75) Inventor: Torsten Vegelahn, Sternenfels (DE)

(73) Assignee: Ekra Automatisierungssysteme GmbH (DE)

( * ) Notice: Subject to any disclaimer, the term of this patent is extended or adjusted under 35 U.S.C. 154(b) by 27 days.

(21) Appl. No.: 13/508,478

(22) PCT Filed: Oct. 12, 2010

(86) PCT No.: PCT/EP2010/006229
§ 371 (c)(1),
(2), (4) Date: May 7, 2012

(87) PCT Pub. No.: WO2011/054432
PCT Pub. Date: May 12, 2011

(65) Prior Publication Data
US 2012/0228364 A1    Sep. 13, 2012

(30) Foreign Application Priority Data

Nov. 6, 2009   (DE) .................. 10 2009 053 575

(51) Int. Cl.
*B23K 31/02*     (2006.01)
(52) U.S. Cl.
USPC ............... 228/122.1; 228/123.1; 228/124.1; 228/124.5; 228/178; 228/179.1
(58) Field of Classification Search
USPC ............ 228/122.1, 123.1, 124.1, 124.5, 178, 228/179.1
See application file for complete search history.

(56) References Cited

U.S. PATENT DOCUMENTS

| | | | |
|---|---|---|---|
| 5,995,232 A | 11/1999 | Van Der Ven | |
| 6,549,288 B1 * | 4/2003 | Migdal et al. | 356/603 |
| 6,847,360 B2 * | 1/2005 | Yahashi | 345/419 |
| 7,600,548 B2 | 10/2009 | Holm et al. | |
| 2008/0197170 A1 | 8/2008 | Prince | |
| 2009/0220812 A1 * | 9/2009 | Kato et al. | 428/548 |

FOREIGN PATENT DOCUMENTS

| | | |
|---|---|---|
| DE | 4119400 | 12/1992 |
| DE | 60030644 | 9/2007 |
| DE | 112007000342 | 1/2012 |

(Continued)

OTHER PUBLICATIONS

JP 2008288515 A computer english translation 2012.*

(Continued)

*Primary Examiner* — Erin Saad
(74) *Attorney, Agent, or Firm* — Kilpatrick Townsend & Stockton LLP

(57) ABSTRACT

The present invention relates to a method for printing a substrate, in particular a printed circuit board, with a printing paste, in particular a solder paste, comprising the following steps: —applying a printing screen to the substrate, —printing the substrate using screen printing technology through openings in the printing screen so as to achieve at least one printed structure consisting of printing paste, —separating the printing screen and the substrate by lifting these parts off from one another, —inserting an optical inspection unit between the printing screen and the substrate, —checking the printed structure in terms of the printing paste thickness thereof by means of the inspection unit, —ending the printing when the result of the printing corresponds to at least one preset value. The invention furthermore relates to an inspection unit (1) and a printing device (2).

6 Claims, 2 Drawing Sheets

(56) References Cited

FOREIGN PATENT DOCUMENTS

Figure 1:
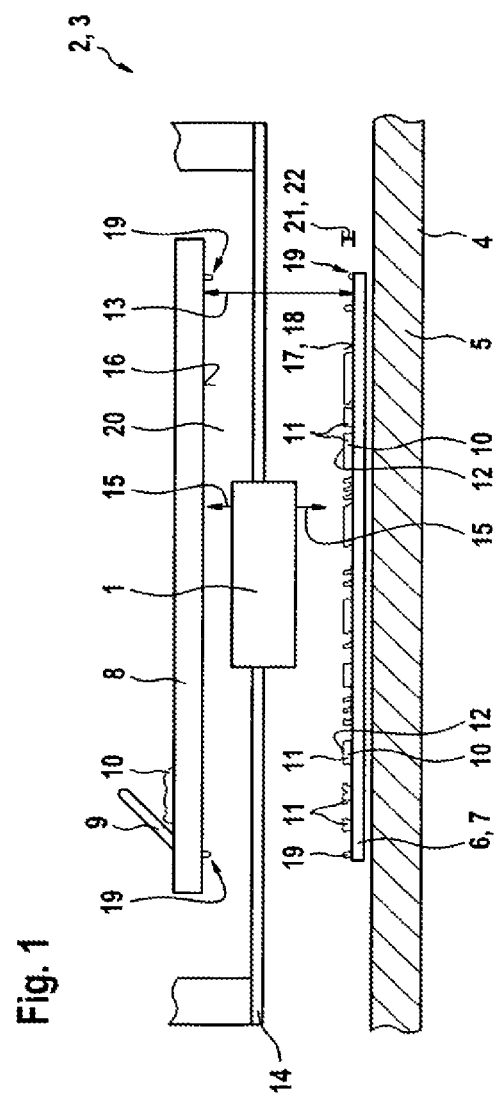

| | | | |
|---|---|---|---|
| EP | 1031417 | | 8/2000 |
| EP | 1076480 | | 2/2001 |
| EP | 1541002 | | 2/2007 |
| EP | 1314342 | | 8/2008 |
| EP | 2071278 | | 6/2009 |
| FR | 2845520 | | 4/2004 |
| GB | 2353759 | | 3/2001 |
| JP | 2008288515 A | * | 11/2008 |
| WO | WO 02/05608 | | 1/2002 |
| WO | WO-0205607 | | 1/2002 |
| WO | WO-2004082345 | | 9/2004 |
| WO | WO-2005083402 | | 9/2005 |
| WO | WO-2007116848 | | 10/2007 |

OTHER PUBLICATIONS

International Search Report dated Mar. 8, 2011 in related International Application No. PCT/EP2010/006229.

International Preliminary Examination Report dated Nov. 11, 2011 in related International Application No. PCT/EP2010/006229.

International Preliminary Report on Patentability in related International Application No. PCT/EP2010/006229 dated Jun. 14, 2012.

* cited by examiner

METHOD AND APPARATUS FOR PRINTING A SUBSTRATE, IN PARTICULAR A PRINTED CIRCUIT BOARD, WITH A PRINTING PASTE

CROSS REFERENCE TO RELATED APPLICATIONS

This application is the U.S. national phase of International Application No. PCT/EP2010/006229 filed on Oct. 12, 2010 as International Publication No. WO 2011/054432, which application claims priority to German Application No. 102009053575.6 filed on Nov. 6, 2009, the contents of both of which are incorporated herein by reference in their entireties.

The invention relates to a method for printing a substrate, in particular a printed circuit board, with printing paste using screen printing technology and an optical inspection of the result of the printing. Furthermore, the invention relates to a printing device, in particular PCB printer as well as an inspection unit for this type of printing device.

Methods for printing a substrate with a printing paste, in particular for printed circuit boards with a solder paste, are known. These kinds of methods are used in printing devices, such as in particular PCB printers for printing circuit boards with solder paste for the subsequent installation of electrical and electronic components. Inside the printing device, the substrate is aligned relative to a printing screen, for example by means of register marks which are recorded with an optical recording device and positioned into the desired relative position to each other, wherein the printing screen and the substrate are moved relative to each other for the alignment. After the printing screen has been placed onto the substrate, solder paste is printed onto the substrate through the printing screen. Next, the substrate is separated from the printing screen, for instance by lifting it off, and transferred out of the printer. This procedure is sequentially repeated for every additional substrate, so that a multitude of substrates are sequentially printed in the same fashion during continuous operation. With this procedure, it is known that surface or line scan cameras are used to perform a two-dimensional registration of the substrate after the printing to check whether the area of the substrate to be printed was printed in the desired fashion. Said optical inspection is unable to provide any information about the printing strength, i.e., the strength of the print application on the substrate. The complete or partial control of the coverage or a control of the coverage including the evaluation of the height is known outside the printing device. The disadvantage of this approach is that it is now only possible to decide whether the print process was successful within the meaning that the specified tolerances are complied with or whether the print process was unsuccessful, meaning that the substrate needs to be discarded as scrap. If the test is only conducted after at least a partial assembly of the printed circuit board and at least outside of the printer, it is no longer possible or only possible with major difficulties to correct printing errors. In the worst case, the printed circuit board is worthless and needs to be discarded.

Said disadvantages are advantageously prevented with the method according to the invention and the inspection unit for a printing device according to the invention as well as the printing device according to the invention.

A method is proposed for printing a substrate, in particular a printed circuit board, with a printing paste, in particular solder paste, comprising the following steps:
applying a printing screen onto the substrate,
printing the substrate using screen printing technology through openings in the printing screen so as to achieve at least one printed structure consisting of printing paste,
separating the printing screen and the substrate by lifting these parts off of each other,
inserting an optical inspection unit between the printing screen and the substrate,
checking the printed structure in terms of the printing paste thickness by means of the inspection unit,
ending the print process when the result of the printing corresponds to at least one preset value.

As known from the prior art, the printing paste/solder paste is applied onto the substrate using screen printing technology through openings in the printing screen, wherein at least one printed structure is created, i.e., an area on the substrate is covered with printing paste/solder paste with a defined coat thickness. The printing screen and substrate are subsequently separated from each other, by lifting these parts off of each other. This means that the parts are separated from each other in vertical direction, namely in such a fashion that no horizontal misalignment or only one that is irrelevant with respect to the printing occurs. The lifting can be carried out such that the substrate remains in unchanged position and the printing screen is lifted, i.e., pulled up from the substrate, provided the printing is applied from the top or in that the printing screen at least essentially remains in unchanged position while the substrate is lowered. The only thing that matters is that the vertical separation does not result in a relevant horizontal misalignment. The optical inspection unit is inserted between the printing screen and the substrate spaced apart from each other in the described fashion and used to check the printed structure in terms of its printing paste thickness. If the result of the printing corresponds to at least one preset value, as it was determined with this test, the print process is stopped. Differently from the prior art, the result of the printing can be checked in terms of the strength of the printing paste application, i.e., in terms of the printing paste thickness already within the printing device, for example in the PCB printer with the proposed method, namely in a fashion in which the printing screen and the substrate are not separated from each other in a horizontal direction, but are still only separated vertically in such a way that they retain the alignment relative to each other required for the print process and only have a distance to each other into which the inspection unit is inserted.

In an advantageous example of the method, it is additionally provided that the printing is corrected at least once by repeating the print process after the prior removal of the inspection unit from the position between the printing screen and the substrate, if the preset value has not been reached. After this step, another check by means of the inspection unit is performed. These two steps can be repeated as often as necessary with the same substrate until the result of the printing corresponds to the preset value. Based on the horizontal relative alignment of the printing screen and the substrate described above which remains unchanged during the inspection, the printing can very easily be repeated by re-doing the print process once more. For this purpose, the inspection unit is removed from the position between the printing screen and substrate required for the inspection and the printing screen is re-positioned onto the substrate, which is possible thanks to the fact that no horizontal displacement of these two parts relative to each other has occurred. In so doing, correcting the printing can be used to correct a deficient coat application by re-applying solder paste once again, i.e., applied to the substrate through openings in the printing screen in order to achieve the desired printing structure, or by removing excess solder paste through the printing screen. This can be achieved, for example, by simply passing over it with a film applicator commonly used in screen printing technology. The excess amount of solder paste which causes an unwanted height of the print application penetrates the openings of the printing screen at the corresponding locations and can be removed with the film applicator passing over it. Of course, it is also possible to both apply solder paste as well as remove excessive solder paste in a single step. In the process, these steps comprising the correction of the printing and repeated inspection by means of the inspection unit are conducted successively as many times as needed until the result of the printing corresponds to the preset value. Only then will the printed substrate also be separated from the printing screen in horizontal direction, i.e., the horizontal relative alignment of the printing screen and the substrate is abandoned, and removed from the printing device.

In a particularly preferred embodiment, it is provided that the inspection is performed with the use of light stripe projection. With light stripe projection, at least one stripe pattern is statically or variably diagonally projected onto the object to be examined, here the printed structure and the projection on the printed structure is detected by means of a detector, for example a camera or a plurality of cameras. The three-dimensional coordinates of the surface detected in this way are calculated by means of the triangulation principle.

In one exemplary method, it is provided that the inspection is performed on a section of the printed structure and/or the substrate to be defined in advance. In principle, it is possible to examine the printed structures across the entire surface of the printed structures and/or the substrate, in particular to conduct a complete inspection of the required strength of the applied print/solder paste strength by means of light stripe projection. A reliable test result for the entire printing of the substrate is obtained in this way. However, because the conduct of an inspection by means of light stripe projection is relatively time-consuming, the inspection is advantageously conducted on critical, representative sections of the printed structure and/or the substrate and the result of this inspection used to make conclusions about the overall print quality or the overall print quality is only considered in view of this section. Sections with a particularly critical shape are especially suitable for this purpose.

In a further preferred exemplary method, the inspection unit is also used for aligning the printing screen and the substrate relative to each other. Said alignment of the printing screen and the substrate is performed prior to the printing, in order to ensure the proper positioning of the printed structures to be created on the substrate. For this purpose, the inspection unit preferably comprises a viewing direction both in the direction of the printing screen as well as in the viewing direction of the substrate. In this way it is very advantageously possible to save separate alignment and position determination units for the printing screen and the substrate. In so doing, the inspection unit can assume the function of detecting the respective position of the printing screen and the substrate, namely in particular in horizontal direction relative to each other.

In a further particularly preferred exemplary method, the surface of the printed structure is examined by means of the inspection unit. In the process, not only the printed structure is examined in terms of the print application strength, i.e., the applied solder paste strength, in particular using the light stripe projection method as described above, but also the areal extent of the printed structure, in particular with respect to its correct geometric areal orientation and shape. Defective spots and/or unwanted gradients are detected in the process. At the same time, the surface of the substrate can be examined to check whether the substrate was printed as desired, i.e., whether the desired print pattern was achieved (2D inspection).

Furthermore, an inspection unit is proposed for a printing device for printing a substrate, in particular a printed circuit board, with a printing paste, in particular solder paste, wherein the inspection unit is used for the optical inspection of a printed structure and is arranged insertable and removable between a printing screen and the substrate. At least one light stripe projection device is provided, which diagonally projects at least one line pattern onto the printed structure to be examined, and at least one detector to determine the line pattern on the printed structure. Thanks to the diagonal projection of the at least one line pattern onto the printed structure, the line stripe projection device allows a three-dimensional inspection of said printed structure, in particular a height inspection within the meaning of an inspection of the print application strength. When the line pattern hits the printed structure, the diagonal projection results in a change of said line pattern, which is detected by the at least one detector. This change of the projected line pattern can be used to calculate the three-dimensional coordinates of the printed structure viewed in this way by means of triangulation, so that conclusions can be made about the height of the printed structure above the substrate, i.e., ultimately about the strength of the print application.

In a preferred embodiment, the inspection unit comprises at least one mirror device which comprises at least one semi-permeable mirror located in the beam path of the inspection unit. This type of mirror device makes it possible that a single detector can look into a plurality of viewing directions originating from the inspection unit, in particular into opposite viewing directions, allowing, for example, a look up toward the printing screen and down toward the substrate when the inspection unit is inserted between the printing screen and the substrate. This makes it possible to use the inspection unit as position recognition and alignment unit prior to performing the printing (namely before lowering the printing screen onto the substrate), so that no separate position detection unit is required. In addition, this allows a continuous reconciliation of the horizontal positions of the printing screen and the substrate, for as long as the inspection unit is inserted between the printing screen and the substrate. The same detector can be used via the mirror device to conduct the light stripe projection and detection of the pattern projected onto the printed structure, i.e., for the inspection as described above. A compact inspection unit can be achieved in this way—by saving components—which is preferably encased in a thermally insulating and/or air conditioned compact case. In such a design, the inspection unit can advantageously be arranged in the PCB printer for the conduct of the inspection within the PCB printer.

In a further preferred embodiment, the inspection unit comprises an evaluation device for evaluating an image recorded by the detector. The evaluation device makes it possible for the inspection unit to evaluate the image recorded by the detector independently. In the process, the recorded image can show a position of the printed screen and substrate or of the printed screen and substrate relative to each other or relative to register marks as they can be attached, for example, at the printing device itself, or the image of the at least one line pattern as it is projected onto the printed structure, or as it is emitted by the light source generating the line pattern recorded by the detector. Consequently, the evaluation device supplies usable results which can be used further as data for the downstream control system. This kind of evaluation device is preferably realized with an electronic circuit, for example a microcontroller and corresponding software.

In a further exemplary embodiment, the inspection unit comprises a control interface for activating the printing device depending on the result of an evaluation conducted by the evaluation device. In this exemplary embodiment, the evaluation device is capable of activating the printing device independently, in particular of issuing control commands to the printing device independently. In such an exemplary embodiment of the inspection unit, essentially representing a smart system, the control device is at least partly controlled by the evaluation device of the inspection unit, for example in view of whether a print process should be repeated because the evaluation of the image recorded by the detector revealed that the desired print quality was not achieved, meaning that it does not correspond to the at least one preset value, as described above.

Moreover, a printing device is proposed, in particular a PCB printer, with an inspection unit as described above, in particular for the conduct of the method for printing a substrate as described above. As a stand-alone self-contained appliance, said type of printing device is capable of conducting the printing including complete quality control and correction of the printing, wherein the production of scrap is very advantageously prevented with the instant quality control of the print process and immediately following correction of a potentially unsatisfactory print process, thus ensuring a consistent high print quality.

Further advantageous exemplary embodiments can be gathered from the sub-claims and combinations thereof.

The invention is explained in more detail below, based on an exemplary embodiment, without being restricted to the latter.

Figure 2:
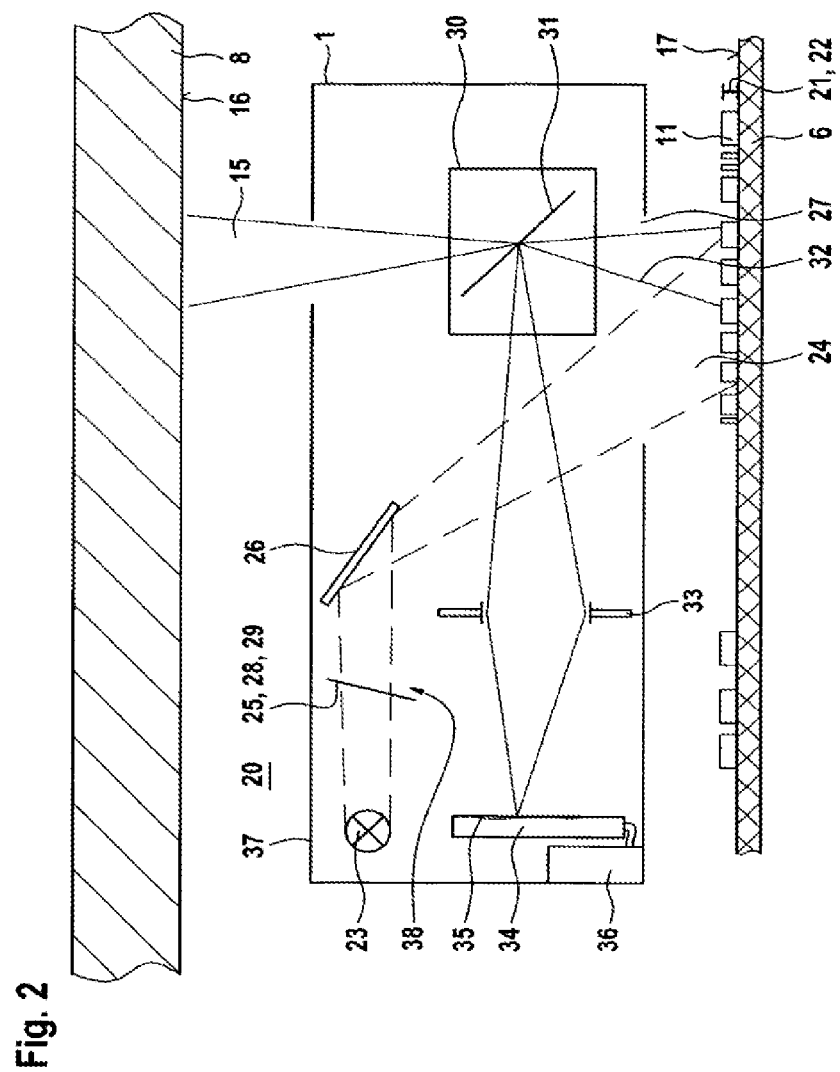

In the figures:

FIG. 1 shows a schematic longitudinal cross-sectional representation of a printing unit with inspection unit, and FIG. 2 shows a schematic representation of an inspection unit during the inspection of a result of the printing.

FIG. 1 shows a schematic longitudinal cross-sectional representation of an inspection unit 1 in an only partly illustrated printing device 2, namely a PCB printer 3. The printing device 2 comprises a printing car 4 as support 5 for the substrate 6 to be printed, namely a printed circuit board 7, on which the substrate 6 is retained in the printing device 2 for the printing. Moreover, the printing device 2 comprises a printing screen 8 which is essentially vertically arranged above the substrate 6 to be printed, which is used to apply solder paste 10 to the substrate 6 through the printing screen 8 during the print process by means of a film applicator device 9 which is only illustrated symbolically. The situation after the printing procedure is illustrated, in which solder paste 10 has created printed structures 11, namely pads 12 made of printed solder paste 10 when the substrate 6 was printed. Similar to before the printing procedure, the printing screen 8 and the substrate 6 are in a vertically spaced-apart, lifted-off position after the printing procedure. A vertical distance 13 is present between them, which is used to insert an inspection unit 1 by way of a shifting device 14, which allows an X/Y displacement, i.e., a two-dimensional movement of the position of the inspection unit 1. In the process, the inspection unit 1 is moved two-dimensionally in one plane, in order to be able to optically capture both the printing screen 8 as well as the substrate 6. For this purpose, the inspection unit 1 has two essentially opposed viewing directions 15, namely preferably vertically out of the plane of its X/Y movement upward, in the direction toward a printing screen underside 16 of the printing screen 8 and downward in the direction toward a substrate top side 17 of the substrate 6, i.e., toward a printed side 18 of the substrate 6. In this way, the inspection unit 1 can also be used for aligning the substrate 6 and printing screen 8 relative to each other, namely in view of their horizontal arrangement. For this purpose, register marks 19 are provided for example both on the printing screen underside 16 as well as on the substrate top side 17, which can be captured by the inspection unit 1 as a result of its viewing directions 15 which are opposed toward the top and the bottom. This allows a very simple and ultra-precise alignment of the substrate 6 and printing screen 8 relative to each other, by moving the substrate 6 and/or the printing screen 8. Prior to the printing, the inspection unit 1 is removed from the area 20 resulting from the vertical distance 13 between the substrate 6 and the printing screen 8, and re-inserted into the area 20 for the purpose of the inspection after the print process is complete, i.e., for inspecting the result of the printing, after the substrate 6 and the printing screen 8 have been lifted off of each other in vertical direction to achieve the vertical distance 13, albeit without changing the horizontal relative alignment of the substrate 6 and the printing screen 8. If the inspection with the inspection unit 1 reveals that the result of the printing does not correspond to at least one preset value, i.e., the achieved printed structures 11 do not meet the expectations, the print process can be repeated after the inspection unit 1 has been removed from the area 20, and the printing screen 8 and the substrate 6 have been placed on top of each other again. Because the horizontal alignment of the printing screen 8 and the substrate 6 has not changed, the exact replacement of the printing screen 8 onto the already printed substrate 6 is possible, so that the film applicator device 9 can be used to apply a corrective coat of solder paste 10 in a new print process, if the previous layer was inadequate. Similarly, it is possible to remove excessive solder paste 10, i.e., an excessively high printed structure 11 by means of the film applicator 9, after the renewed precisely aligned placement of the printing screen 8 onto the substrate 6, such that the printed structures 11 have a desired print application strength 21. In this context, the print application strength 21 simply means a height 22 to be created by the printed structures 11 above the substrate top side 17.

Only when the inspection by the inspection unit 1 yields the expected result of the printing is the printed substrate 6 ejected or transported out of the printing device 2. This helps very advantageously prevent the production of scrap. In fact, the result of the printing can be checked within the printing device 2, allowing a correction of a result of the printing that does not meet the expectations still inside the printing device 2.

FIG. 2 shows a schematic cross-sectional representation of the inspection unit 1 in an inspection position in the area 20 between the substrate 6 printed with printed structures 11 and the printing screen 8. The inspection unit 1 has a case 37 with a light source 23 arranged inside it, in the beam path of which a line pattern 25 is arranged to achieve a line stripe projection 24 onto the printed structures 11 of the substrate 6, said line pattern being projected diagonally through an opening in the underside 27 of the inspection unit 1 onto the substrate 6 and the printed structures 11 arranged on it via a deflection mirror 26, illuminated by a light source 23. Instead of a simple line pattern 25, for example as inspection model 28, it is also possible to use a line pattern generator 29 for generating an alternating line pattern in order to be able to project changing/different line patterns 25 successively or alternatively diagonally onto the substrate 6 and the printed structures 11 arranged on it. A light stripe projection device 38 is created in this way. Furthermore, the inspection unit 1 comprises a mirror device 30, preferably arranged on the inside of the case 37 on the opposite side of the opening on the underside 27 or a section of the opening of the underside 27, said mirror device 30 comprising at least one semipermeable mirror 31, which is used to direct an evaluation beam path 32 capturing the substrate 6 on a substrate top side 17 through the opening on the underside 27 onto a detector 34 through an adjustable screen 33, if necessary through an additional optical system which is designed as a camera or line sensor. The detector 34 captures an image 35 of the substrate top side 17 printed with printed structures 11 and supplies this image 35 to an evaluation device 36. Using the optical distortions of the projected line pattern 25 of the light stripe projection 24 resulting from the height 22 of the printed structures 11, the evaluation device 36 determines the height 22 by way of triangulation. This allows the establishment of a quantitative conclusion as to whether the print application strength 21, namely the recorded height 22 of the printed structures 11 above the substrate top side 17 corresponds to the preset value, meaning that the result of the printing is satisfactory or whether the printing procedure needs to be corrected.

As described earlier for FIG. 1, the alignment of the substrate 6 and the printing screen 8 can be corrected relative to each other (in X/Y direction) by means of the viewing direction 15 in the direction onto the printing screen underside 16, while it is also possible to check the horizontal correspondence in the X/Y direction of printed structures 11 with the positions defined by the printing screen 8 during the inspection of the result of the printing.

REFERENCE LIST

1 Inspection unit
2 Printing device
3 PCB printer
4 Printing car
5 Support
6 Substrate
7 Printed circuit board
8 Printing screen
9 Film applicator device
10 Solder paste
11 Printed structure
12 Pads
13 Vertical distance
14 Shifting device
15 Viewing direction
16 Printing screen underside
17 Substrate top side
18 Printed side
19 Register mark
20 Area
21 Print application strength
22 Height
23 Light source
24 Light stripe projection
25 Line pattern
26 Deflection mirror
27 Opening on the underside
28 Inspection model
29 Line pattern generator
30 Mirror device
31 Semipermeable mirror
32 Evaluation beam path
33 Screen
34 Detector
35 Image
36 Evaluation device
37 Case
38 Light stripe projection device

The invention claimed is:

1. A method for printing a substrate with a printing paste, comprising the following steps:
 (a) applying a printing screen onto a substrate,
 (b) printing the substrate using screen printing technology through openings in the printing screen so as to achieve at least one printed structure consisting of printing paste,
 (c) separating the printing screen and the substrate by lifting these parts off of each other,
 (d) inserting an optical inspection unit between the printing screen and the substrate wherein the optical inspection unit comprises a mirror device that includes at least one semipermeable mirror located in a beam path of the inspection unit,
 (e) checking the printed structure in terms of the printing paste height by means of the optical inspection unit, the optical inspection unit performing a light stripe projection and triangulation via the mirror device,
 (f) ending the printing when the result of the printing corresponds to at least one preset value, wherein the optical inspection unit is also used for aligning the printing screen and the substrate relative to each other via the mirror device,
 (g) performing an at least one-time correction of the printing by repeating the printing process after a prior removal of the optical inspection unit from the position between the printing screen and the substrate, if the preset value has not been reached; and re-inspection by means of the optical inspection unit.

2. The method according to claim 1, wherein the step of checking the printed structure by means of the optical inspection unit further comprises the step of conducting the inspection on a section of the printed structure and substrate to be defined in advance.

3. The method according to claim 1, further comprising the step of inspecting the surface of the printed structure by means of the optical inspection unit.

4. A method according to claim 1, wherein the step of checking the printed structure by means of the optical inspection unit further comprises the step of conducting the inspection on a section of the printed structure or substrate to be defined in advance.

5. A method according to claim 1, wherein the substrate is a printed circuit board.

6. A method according to claim 1, wherein the printing paste is a solder paste.

* * * * *